(12) United States Patent
Darriet et al.

(10) Patent No.: US 7,898,359 B2
(45) Date of Patent: Mar. 1, 2011

(54) MODULAR SWITCHING ARRANGEMENT

(75) Inventors: Stephane Darriet, Paris (FR); Cicero S. Vaucher, Eindhoven (NL)

(73) Assignee: ST-Ericsson SA, Geneva (CH)

( * ) Notice: Subject to any disclaimer, the term of this patent is extended or adjusted under 35 U.S.C. 154(b) by 283 days.

(21) Appl. No.: 11/814,163

(22) PCT Filed: Jan. 13, 2006

(86) PCT No.: PCT/IB2006/050122

§ 371 (c)(1),
(2), (4) Date: Apr. 29, 2008

(87) PCT Pub. No.: WO2006/075307

PCT Pub. Date: Jul. 20, 2006

(65) Prior Publication Data

US 2008/0278216 A1    Nov. 13, 2008

(30) Foreign Application Priority Data

Jan. 17, 2005    (EP) .................................. 05100239

(51) Int. Cl.
*H01P 1/10*    (2006.01)
*H01P 1/15*    (2006.01)

(52) U.S. Cl. ...................... 333/103; 333/101
(58) Field of Classification Search ............... 333/101, 333/103, 104, 81 R See application file for complete search history.

(56) References Cited

U.S. PATENT DOCUMENTS

| | | | |
|---|---|---|---|
| 2,535,303 A | | 12/1950 | Lewis |
| 4,097,827 A | * | 6/1978 | Williams .................. 333/81 R |
| 4,843,354 A | * | 6/1989 | Fuller et al. ............... 333/81 A |
| 5,327,017 A | | 7/1994 | Fischer et al. |
| 5,510,757 A | * | 4/1996 | Kumar et al. ............... 333/104 |
| 7,546,101 B2 | * | 6/2009 | Murphy .................... 455/249.1 |

FOREIGN PATENT DOCUMENTS

| | | |
|---|---|---|
| EP | 0438228 A2 | 7/1991 |
| FR | 1477619 A | 4/1967 |

OTHER PUBLICATIONS

Tayrani, R; et al "Broad-Band SIGE MMICS For Phased-Array Radar Applications" IEEE Journal Of Solid-State Circuits, vol. 38, No. 9, Sep. 2003, pp. 1462-1470.

* cited by examiner

*Primary Examiner*—Dean O Takaoka

(57) ABSTRACT

The present invention relates to a switching arrangement and method of manufacturing such an arrangement, wherein first and second series-shunt diode structures (D1/D2, D3/D4) are connected to each other in a mirrored configuration to obtain a basic switching cell. This basic switching cell can be used to build a SPDT switch which in turn can be used to build a DPDT switch or switches of higher complexity. Thereby, high isolation and low power consumption can be achieved with the additional advantage of modularity.

20 Claims, 4 Drawing Sheets

MODULAR SWITCHING ARRANGEMENT

CROSS-REFERENCE TO RELATED APPLICATION(S)

The present application claims priority under 35 U.S.C. §365 to International Patent Application No. PCT/IB2006/050122 filed Jan. 13, 2006, entitled "MODULAR SWITCHING ARRANGEMENT". International Patent Application No. PCT/IB2006/050122 claims priority under 35 U.S.C. §365 and/or 35 U.S.C. §119(a) to European Patent Application No.05100239.2filed Jan. 17, 2005 and which are incorporated herein by reference into the present disclosure as if fully set forth herein.

TECHNICAL FIELD

The present invention relates to a switching arrangement and in particular to diode switches for selectively switching between a first predetermined number of input terminals and a second predetermined number of output terminals.

BACKGROUND

Switching arrangements are key components of transceiver systems for use in e.g. microwave applications or other high frequency applications. A common application of such switching arrangements is a transmit/receive switch in wireless systems, which may be used for switching a connection of an antenna to a low noise amplifier (LNA) in a receiving mode, and a connection of the antenna to a power amplifier (PA) in a transmitting mode. Such a switch is called single-pole double-throw (SPDT) switch.

Other applications may require a switch with two inputs and two outputs, which in this case is called a double-pole double-throw (DPDT) switch. For example, in consumer satellite communication systems, two polarities can be received at a receiver input, i.e. a vertical and a horizontal polarity. In order to provide a watch-and-record capability of a satellite receiver, two down converters are required, one for providing the polarization and band selection for the watch functionality, and a second one for selecting the polarization and band selection for the recording functionality. The switching functionality can be provided by using a DPDT switch as an interface between the two antennas and the two down-converters.

The DPDT switch is commonly also known as transfer switch and may be available in UHF/VHF (Ultra High Frequency/Very High Frequency) bands covering 10 MHz to 2 GHz, and microwave bands covering 10 MHz to 20 GHz and above.

FIG. 1 shows four possible switching states A to D of a DPDT switch and a block diagram of a possible implementation. It is noted that the switching states C and D switch a single input to two outputs, while the second input is left unconnected. The block diagram on the right side of FIG. 1 shows a DPDT switch 10 as a parallel combination of SPDT switches 11, 12. The switching states A to D can be selected based on control voltages supplied to corresponding control terminals of the DPDT switch.

Many microwave switches use PIN diodes in their implementation. A forward biased PIN diode can be regarded as a current controlled resistor wherein the resistance decreases with increasing forward current due to increased carrier density in the intrinsic zone (I). A reverse biased PIN diode can be regarded as a voltage-controlled capacitor, wherein the capacitance decreases with increasing reverse voltage due to an increased width of the intrinsic zone (I).

R. Tayrani et al., "Broad-Band SiGe MMICs for Phased-Array Radar Applications", IEEE JOURNAL OF SOLID-STATE CIRCUITS, 38 (9): 1462-1470, September 2003, describes use of standard diodes (PN diodes without intrinsic zone) available in mainstream IC (Integrated Circuit) technologies, instead of PIN diodes. In particular, a SPDT switch with PN diodes is described there.

FIG. 2 shows a schematic circuit diagram of the SPDT switch as described in the above prior art, wherein two branches connected to a second port P2 and a third port P3 each have a series diodes D1, D3 and a shunt diodes D2, D4 in each path. Such diode structures consisting of a series diode and a shunt diode are called series-shunt diode structures. If a first port P1 is connected to the second port P2, then the series diode D1 is forward biased with a given value of DC current, and the shunt diode D2 is in reverse bias which creates a low parasitic capacitance in parallel to the signal path. At the same time, the series diode D3 in the branch of the third port P3 is set in reverse bias, and the shunt diode D4 is biased with a DC current, which effectively short-circuits the third port P3 to ground. This arrangement improves isolation of the switch in comparison to just a single series diode in the signal path. The biasing of the diodes is achieved by applying biasing voltages Vb1 to Vb3.

It is noted that the circuit diagram in FIG. 2 is based on a microstrip or stripline technology with microstrip or stripline portions indicated as rectangular blocks or t-shaped blocks. Resistors R1 to R3 are indicated in FIG. 2 as triangular wave patterns. In contrast thereto, resistors are indicated in the following figures as rectangular blocks.

Thus, PN diodes are connected to the transmission line in series or in shunt. Isolation is achieved by reverse biasing series-connected diodes or forward biasing shunt-connected diodes. The shunt-connected diode provides the most effective means for achieving broadband and relatively frequency independent isolation. It is ideally frequency independent, but practically small parasitic reactances generally effect broadband performance. Isolation is also achieved by reverse biasing series-connected diodes. Isolation for series-connected diodes decreases with increasing frequency. The combined series-shunt diode configurations or structures are frequently employed in multi-throw broadband switches to achieve relatively high isolation in a simple structure.

However, the above conventional switching arrangement is disadvantageous in that it needs control voltages of 0V, 3.8V and a negative value of −6.8V. Furthermore, the achieved isolation might not be good enough for specific applications, and a relatively high current consumption of e.g. 2 mA is observed.

In addition, a further drawback resides from the fact that the SPDT switch of FIG. 2 cannot be used as a modular switch for building higher order switches, such as a DPDT switch shown in FIG. 1. The reason therefore is that an unused input in the SPDT switch of FIG. 2 is shunt or short-circuited to ground to improve isolation as discussed above. This is however not compatible with the above switching states A and B in FIG. 1.

It is therefore an object of the present invention to provide an improved switching arrangement with a modular switching cell structure which can be used to built SPDT, DPDT and higher order switches.

SUMMARY

This object is achieved by a switching arrangement as claimed in claim 1 and by a manufacturing method as claimed in claim 10.

Accordingly, a switching arrangement is proposed, which is based on a new modular switch building block or switching cell having two series-shunt diode structures in mirrored configuration. This modular building block or switching cell can be used to generate different switch configurations, such as SPDT, DPDT and other more complex switches. The proposed switching arrangement can be built with standard diodes (PN diodes) and provides an improved isolation, decreased power consumption and control with low-voltage digital signals.

In view of the mirrored configuration of the first and second series-shunt diode structures, control voltages applied to the first and second control terminals have an inverse relationship to each other and inverter means may thus be provided for inverting a control voltage supplied to one of the first and second control terminals, and for supplying the inverted control voltage to the other one of the first and second controlled terminals. Thereby, only one type of control voltage has to be generated, and the other value can be obtained by commonly known inverter circuits, such as an operational amplifier or a logic inverter circuit.

The polarization means may comprise a first resistor connected between the input and the first control terminal and a second resistor connected between the output and the second control terminal. This serves to polarize input and output nodes based on the applied control voltages.

The switching arrangement may comprise a first pair of the switching cells connected to each other at the first control terminal and at the output terminal, so that a two-input-single-output switch or SPDT switch is formed.

As an alternative, the switching arrangement may comprise a second pair of the switching cells connected to each other in the same way as the first pair, wherein the first and second pairs are connected to each other at their respective input terminals to form a two-input-two-output switch or DPDT switch. Thereby, the modular switching cell can be used to build SPDT switches or DPDT switches in a modular manner. In case specific output terminals are not used, disabling means may be provided for applying a predetermined voltage at all polarization nodes of a selected switching cell.

For higher order switches, the switching arrangement may comprise a plurality of pairs of the switching cells, connected to each in a manner to form a switch with a first number of inputs and a second number of outputs.

The switching arrangement may be a microwave switching arrangement, and the first and second series-shunt diode structure may comprise PN diodes. Furthermore, the switching arrangement may be integrated on a single chip.

BRIEF DESCRIPTION OF THE DRAWINGS

The present invention will now be described on the basis of preferred embodiments with reference to the accompanying drawings in which.

DETAILED DESCRIPTION

The preferred embodiments will now be described based on a modular switching cell using series-shunt diode structures to keep good isolation, but avoiding inputs from being short-circuited to ground.

Figure 3:
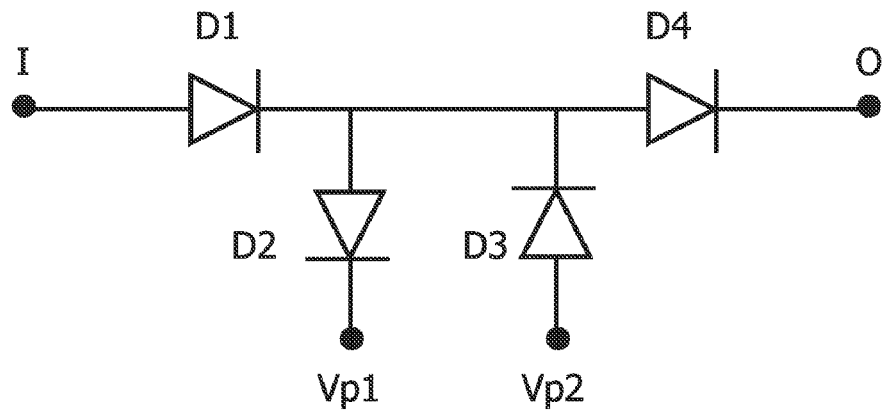
FIG. 3 shows a schematic circuit diagram of two series-shunt diode structures in a mirrored configuration.

FIG. 3 shows a schematic circuit diagram of the proposed switching cell structure which consists of two series-shunt diode structures mirror to each other, so as to isolate a short-circuited node or shunt node from the input I and the output O. For example, if the input I is short-circuited via a first series diode D1 and a first shunt diode D2, the output can be isolated by the second series-shunt diode structure consisting of a second series diode D4 and a second shunt diode D3, which both can be set into a reverse-biased state by a suitable control voltage or polarization voltage Vp2 to thereby isolate the output O from the state of the input I. The input state can be controlled by any other control voltage or polarization voltage Vp1.

Thus, to control the switching cell of FIG. 3, a digital signal (e.g. 0V or 3.3V) has to be applied. Each series-shunt diode structure of FIG. 3 can be used separately, to open or to switch on the fundamental structure. If the two series-shunt diode structures consisting of the diodes D1, D2 and D3, D4, respectively, are to be used separately with only one control voltage, an inverter can be used. Thereby, a control voltage Vc can be applied to one control input node, while the inverted control voltage $\overline{Vc}$ can be applied to the other control node.

Figure 4:
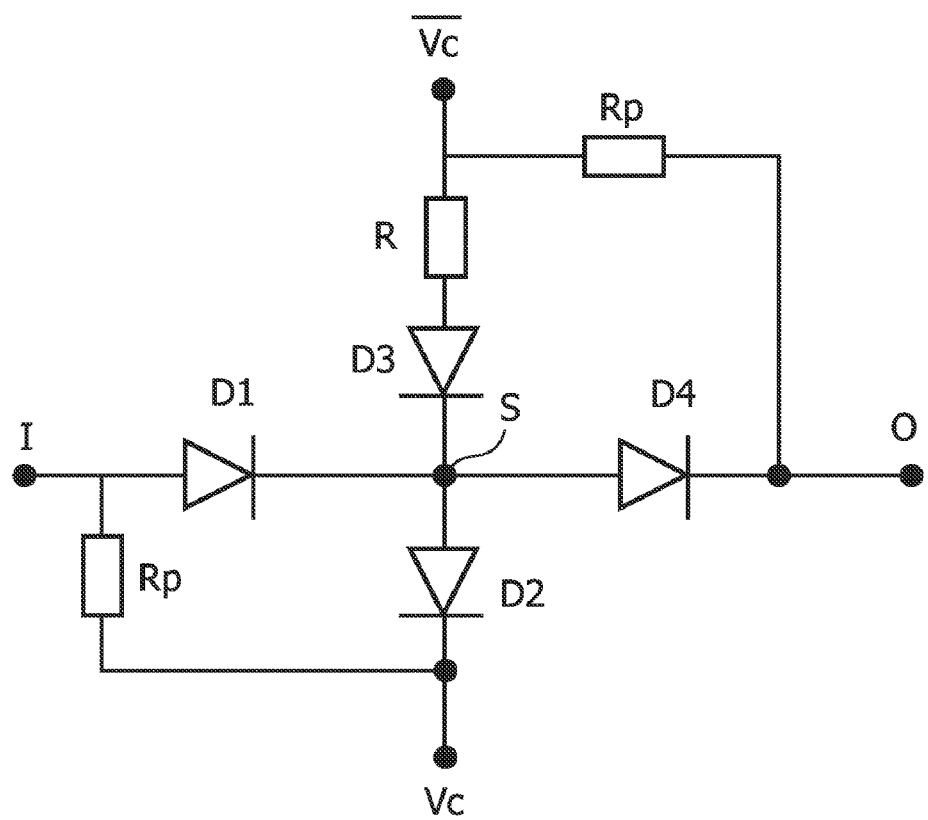
FIG. 4 shows a switching cell employing the mirrored series-shunt diode structure of FIG. 3.

FIG. 4 shows a schematic circuit diagram of the proposed switching cell with inverted control voltages. In FIG. 4, the two series-shunt diode structures D1/D2 and D3/D4 are connected to each other at a central shunt node S which can be isolated from the input I by the first series diode D1 and from the output O by the second series diode D4. Moreover, the input and output nodes I, O are polarized by connecting them via a respective polarization resistor Rp to a respective one of the control voltage Vc and the inverted control Voltage $\overline{Vc}$. The inverter or inverter circuitry used for generating the inverted control voltage $\overline{Vc}$ is not shown in FIG. 4 and can be any suitable analogue or digital converter circuit. The polarization resistors Rp serve to define the logical state at the input I and output O, if the respective series diode D1 or D4 is in a non-conducting state. The value of the series resistor R is selected to obtain a predetermined polarization current for the diodes, which may be 500 µA, for example. This value is chosen as a trade-off between the loss due to the diode series resistance and the loss due to the polarization resistors Rp.

Figure 2:
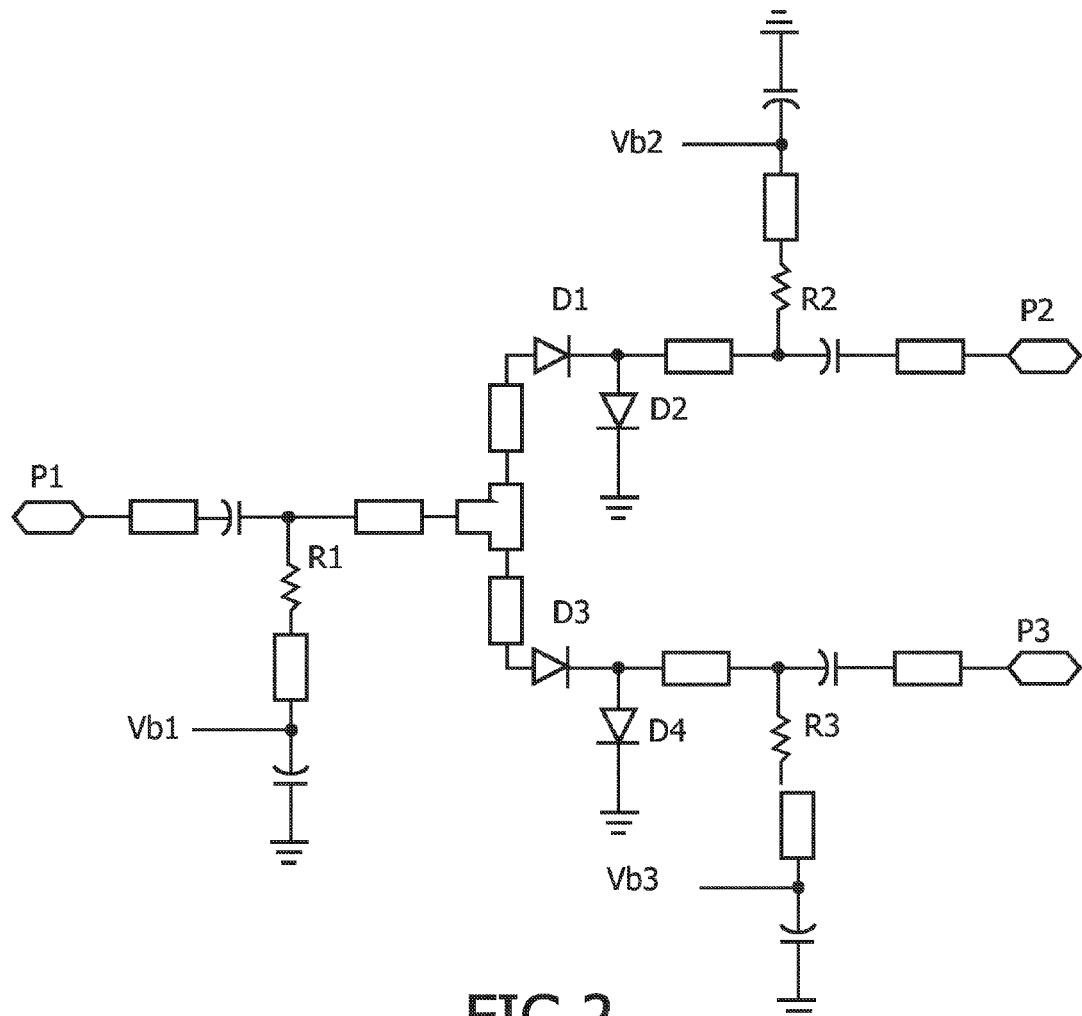
FIG. 2 shows a schematic circuit diagram of a conventional SPDT switch.
Figure 5:
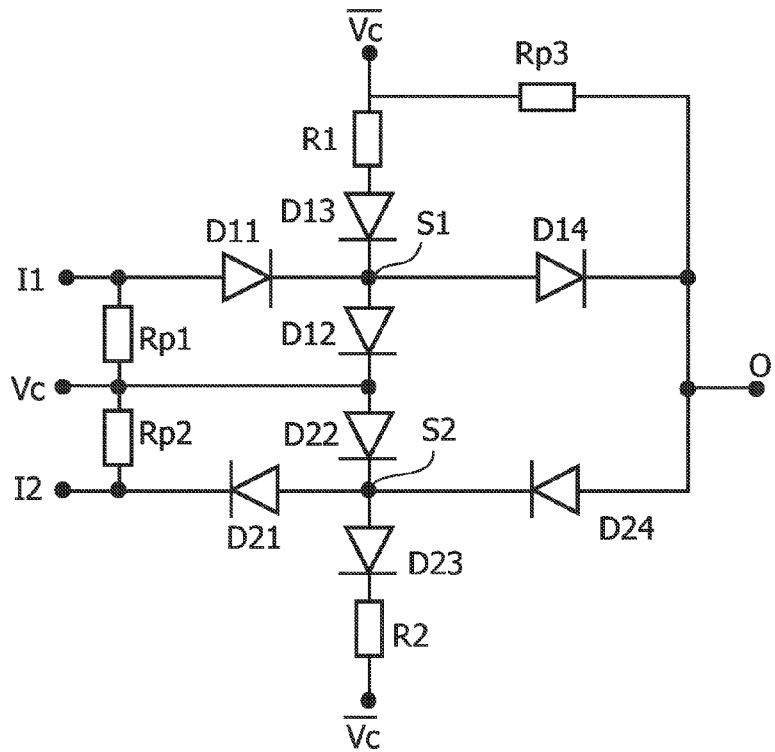
FIG. 5 shows a modular SPDT structure according to a first preferred embodiment.

FIG. 5 shows an example of a modular SPDT switch obtained by connecting together two switching cells of FIG. 4 at their output O and at their control terminal to which the control voltage Vc is applied. Thereby, two inputs I1 and I2 can be selectively switched to a single output O by applying a control voltage Vc with a suitable logical value. This new SPDT switch concept leads to an improved isolation which is around 17 dB better than the isolation of the conventional SPDT switch shown in FIG. 2. Moreover, the proposed SPDT switch according to the present invention needs only one voltage value of the control voltage Vc (e.g. 3.3V). A negative voltage value is not used. The current consumption of the SPDT switch of FIG. 5 is about at least half of the current consumption of the conventional switch, e.g. about 1 mA. As an additional advantage, the size of the SPDT switch can be reduced to about 400 μm×400 μm with a matching network, and 200 μm×250 μm without matching network.

Figure 6:
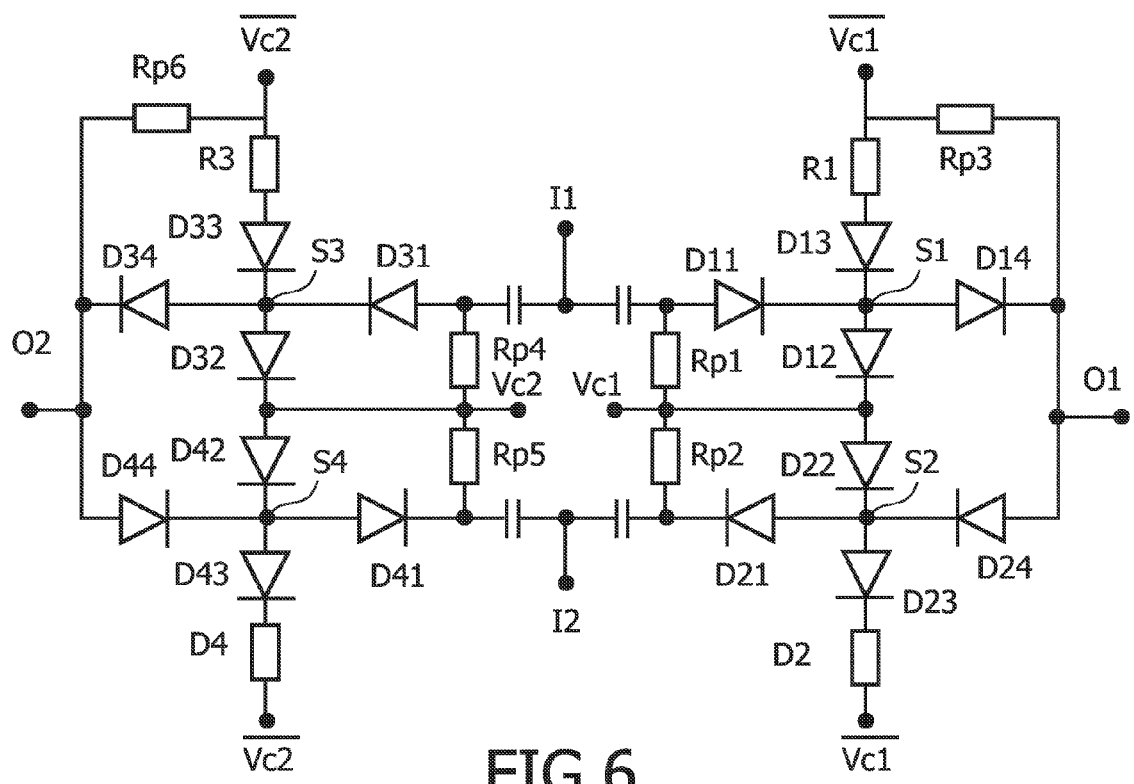
FIG. 6 shows a modular DPDT structure according to a second preferred embodiment.

FIG. 6 shows a modular DPDT structure according to the second preferred embodiment, in which four switching cells of FIG. 4 or two SPDT switches of FIG. 5 are connected to each other. In particular, the DPDT switch is obtained by connecting the two SPDT switches at their inputs I1 and I2 to thereby obtain a DPDT structure with two inputs I1 and I2 and two outputs O1 and O2. In this DPDT structure four shunt nodes S1 to S4 are provided which can be selectively isolated from the respective input and output nodes. Furthermore, the selective switching between the input nodes I1 and I2 and the output nodes O1 and O2 is controlled by respective control voltages Vc1, Vc2 and their inverted values $\overline{Vc1}$ and $\overline{Vc2}$.

Figure 1:
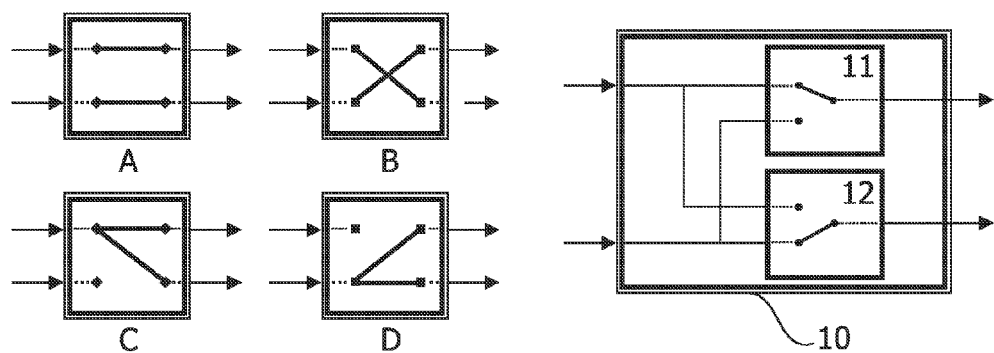
FIG. 1 shows different switch states and a block diagram of a DPDT switch.

It can be shown that the insertion loss of this modular DPDT switch is substantially the same as the insertion loss of the SPDT switch of FIG. 5. This proves the modularity power of the switching cell of FIG. 4. Now, a SPDT switch can be transformed into a DPDT switch by just adding another SPDT switch. In the switch state C of FIG. 1, the insertion loss increases by about 3 dB compared to switch state A. This results from the power division principle in case of one input and two outputs, where the power is divided by two. A major advantage of the modular switching arrangement according to the preferred embodiments is the modularity achieved by the switching cell of FIG. 4.

In case more complex switches with arbitrary combinations of inputs and outputs are desired, a disable functionality can be easily implemented. This functionality is a logical function or means which puts all DC polarization nodes at the same voltage. It is thereby possible to build switches with different configurations, due to the fact that any output can be connected or not connected to an input. In case of a switch with two inputs and five outputs, three outputs can be connected to the first input, while one output can be connected to the second input and the last output can be disabled, i.e. disconnected by using the disable functionality.

Figure 7:
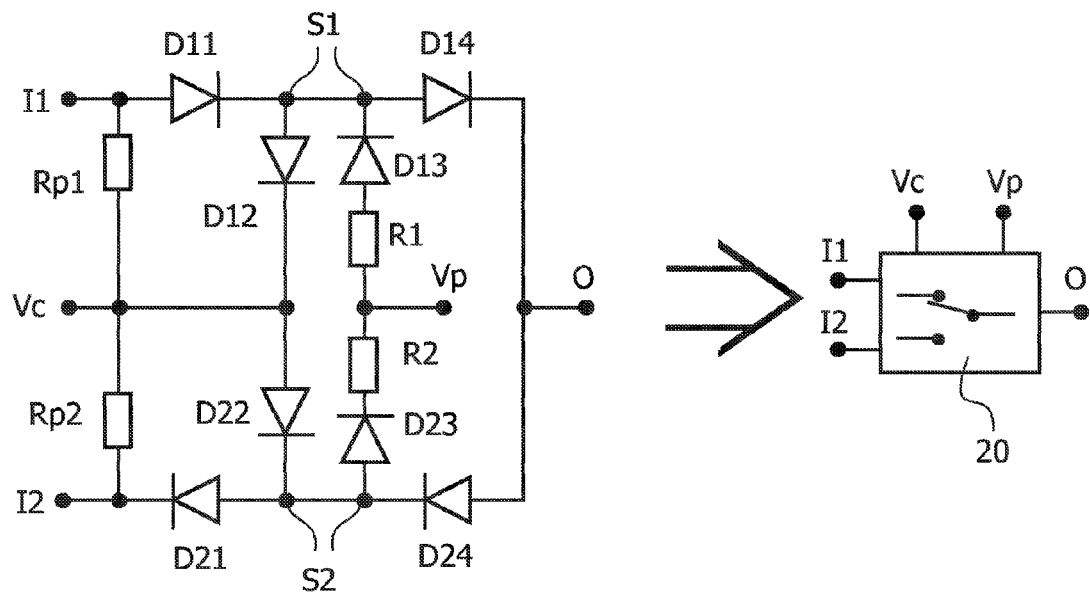
FIG. 7 shows a schematic circuit diagram of a SPDT cell according to a third preferred embodiment.

FIG. 7 shows a schematic circuit diagram of a SPDT cell according to the third preferred embodiment and a corresponding representation as building block 20 of more complex schemes. In contrast to the SPDT cell of FIG. 5, the inverted control terminals are combined as a single control terminal to which a polarization voltage Vp is applied. Furthermore, the third polarization resistor Rp3 has been removed. The disable functionality now merely functions to apply same voltages Vc and Vp to the control terminals of the SPDT cell 20 if this SPDT cell 20 is to be disabled. As an example, the disable functionality may thus simply be implemented by bypassing the inverter functionality which generates the inverted voltage Vp from the non-inverted voltage Vc.

Figure 8:
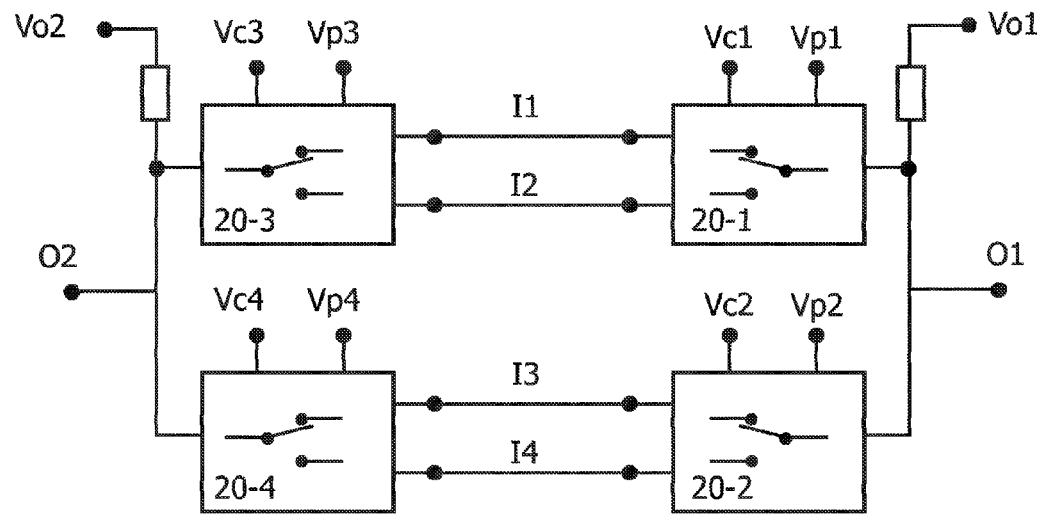
FIG. 8 shows a schematic block diagram of a modular four-input-two-output switch according to a fourth preferred embodiment.

FIG. 8 shows a schematic block diagram of a four-input-two-output switch implemented by combining four SPDT cells of FIG. 7. As can be gathered from FIG. 8, this arrangement is achieved by connecting two respective SPDT cells 20-1/20-3 and 20-2/20-4 at their respective inputs I1/I2 and I3/I4 to obtain respective DPDT structures which are connected in parallel at their outputs O1 and O2 to thereby obtain a switching arrangement or switching structure with four inputs I1 to I4 and two outputs O1 and O2, wherein the switching state can be controlled by the control voltage Vc1 to Vc4 and Vp1 to Vp4.

It is to be noted that the present invention is not restricted to the above preferred embodiments, but can be applied to obtain any switching arrangement with a first predetermined number of inputs and a second predetermined number of outputs as a modular arrangement. Moreover, the diodes of the preferred embodiments may be replaced by any kind of electronic device or semiconductor device showing a valve behavior. In particular, the diodes may be replaced by transistor elements or other semiconductor switches. The polarization resistors may be replaced by any other polarization elements or means, such as inductors or the like.

The described preferred embodiments may be implemented as an electronic circuit provided on a circuit board, or as an integrated circuit provided on a single chip. In the latter case, the switches according to the above preferred embodiments may be manufactured or designed by the following steps:

1. Creating a structure or mask for only one output to obtain a modular switching cell;
2. Duplicating the structure for as many outputs as needed; and
3. Placing the DC output polarization nodes for controlling the switching behavior or switching state of the obtained modular switching arrangement.

As an example for a microwave application of the proposed switching arrangements according to the preferred embodiments, the above manufacturing or design procedure can be performed using e.g. a QUBiC4G process which is an advanced BiCMOS (Bipolar Complementary Metal Oxide Semiconductor) process for RF IC (Radio Frequency Integrated Circuit) technologies. It enables passive components to be integrated on-chip, vastly reducing the bill-of-materials and the number of peripheral components required. It also offers low power consumption for a wide range of analogue and mixed-signal IP blocks. QUBiC4G(SiGe) thus provides enhanced performance for advanced RF applications. As an alternative, RF CMOS, GaAs (Gallium Arsenide) and bipolar technologies may be used for implementing the proposed switching arrangement, wherein the improved manufacturing or design procedure leads to a more effective manufacturing due to the modular processing.

In summary, the present invention relates to a switching arrangement and method of manufacturing such an arrangement, wherein first and second series-shunt diode structures are connected to each other in a mirrored configuration to obtain a basic switching cell. This basic switching cell can be used at a SPDT switch which in turn can be used to build a DPDT switch or switches of higher complexity. Thereby, high isolation and low power consumption can be achieved with the additional advantage of modularity. With a low digital control voltage, the switching arrangement can be used for microwave applications such as satellite television reception or other applications such as cellular transceivers, where a high isolation is required.

It should further be noted that the above-mentioned embodiment illustrates rather than limits the invention, and that those skilled in the art will be capable of designing many alternative embodiments without departing from the scope of the invention as defined in the dependent claims. In the claims, any reference signs placed in parenthesis shall not be construed as limiting the claims. The words "comprising" and "comprises", and the like, do not exclude the presence of elements or steps other than those in any claim or the specification as a whole. The singular reference of an element does not exclude the plural reference of such elements and vice versa. If certain measures are recited in mutually different dependent claims, this does not indicate that a combination of these measures cannot be used to advantage.

What is claimed is:

1. A switching arrangement comprising at least one modular switching cell, the modular switching cell comprising:
   a first series-shunt diode structure having a first series connected diode provided at an input of the switching cell and a first shunt connected diode connected between an intermediate node and a first control terminal for controlling a switching state of the first shunt connected diode, the first shunt connected diode being connected to the intermediate node at an anode connection of the first shunt connected diode;
   a second series-shunt diode structure having a second series connected diode provided at an output of the switching cell and a second shunt connected diode connected between the intermediate node and a second control terminal configured to control a switching state of the second shunt connected diode, the second series connected diode being connected to the output at a cathode connection of the second series connected diode; and
   a polarization structure connected between one of the input and output and at least one of the first and second control terminals.

2. A switching arrangement according to claim 1, further comprising an inverter configured to invert a control voltage supplied to one of the first and second control terminals and supply the the inverted control voltage to the other one of the first and second control terminals.

3. A switching arrangement according to claim 1, wherein the polarization structure comprise a first resistor connected between input and the first control terminal and a second resistor connected between the output and the second control terminal.

4. A switching arrangement according to claim 1, wherein the switching arrangement comprises a first pair of the switching cells connected to each other at the first control terminal and at the output terminal so that a two-input-single-output switch is formed.

5. A switching arrangement according to claim 4, wherein the switching arrangement comprises a second pair of the switching cells connected to each other in the same way as the first pair, wherein the first and second pairs are connected to each other at their respective input terminals to form a two-input-two-output switch.

6. A switching arrangement according to claim 4, wherein the switching arrangement comprises a plurality of pairs of the switching cells, connected to each other in a manner to form a switch with a first number of inputs and a second number of outputs.

7. A switching arrangement according to claim 4, further comprising a disabling structure configured to apply a predetermined voltage at all polarization nodes of a selected switching cell to disable the output terminal of the selected switching cell.

8. A switching arrangement according to claim 1, wherein the switching arrangement is a microwave switching arrangement and the first and second series-shunt diode structure comprise PN diodes.

9. A switching arrangement according to claim 1, wherein the switching arrangement is integrated on a single chip.

10. A modular switching cell comprising:
    a first series-shunt diode structure comprising:
       a first series-connected diode at an input of the switching cell, and
       a first shunt-connected diode connected between an intermediate node and a first control terminal configured to control a switching state of the first shunt-connected diode, the first shunt connected diode being connected to the intermediate node at an anode connection of the first shunt connected diode;
    a second series-shunt diode structure comprising:
       a second series-connected diode at an output of the switching cell, and
       a second shunt-connected diode connected between the intermediate node and a second control terminal configured to control a switching state of the second shunt-connected diode, the second series connected diode being connected to the output at a cathode connection of the second series connected diode; and
    a polarization structure connected between one of the input and output and at least one of the first and second control terminals.

11. A modular switching cell according to claim 10, further comprising an inverter structure configured to invert a control voltage supplied to one of the first and second control terminals and to supply the inverted control voltage to the other one of the first and second control terminals.

12. A modular switching cell according to claim 10, wherein the polarization structure comprise a first resistor connected between the input and the first control terminal and a second resistor connected between the output and the second control terminal.

13. A modular switching cell according to claim 10, further comprising a disabling structure configured to apply a predetermined voltage at a polarization node of the switching cell to disable the output terminal of the switching cell.

14. A modular switching cell according to claim 10, wherein the first and second series-shunt diode comprise PN diodes.

15. A modular switching cell according to claim 10, wherein the modular switching cell is integrated on a single chip.

16. A method comprising:
    operating a first series-shunt diode structure, wherein the first series-shunt diode comprises a first series-connected diode at an input of the switching cell and a first shunt-connected diode connected between an intermediate node and a first control terminal configured to control a switching state of the first shunt-connected diode, the first shunt connected diode being connected to the intermediate node at an anode connection of the first shunt connected diode;
    operating a second series-shunt diode structure, wherein the second series-shunt diode structure comprises a second series-connected diode at an output of the switching cell and a second shunt-connected diode connected between the intermediate node and a second control terminal configured to control a switching state of the second shunt-connected diode, the second series connected diode being connected to the output at a cathode connection of the second series connected diode; and
    polarizing the input and output and at least one of the first and second control terminals.

17. A method according to claim 16 further comprising:
inverting a control voltage supplied to one of the first and second control terminals; and
supplying the inverted control voltage to the other one of the first and second control terminals.

18. A method according to claim 16, wherein the polarization structure comprise a first resistor connected between the input and the first control terminal and a second resistor connected between the output and the second control terminal.

19. A method according to claim 16, further comprising:
applying a predetermined voltage at a polarization node of the switching cell to disable the output terminal of the switching cell.

20. A method according to claim 16, wherein the first and second series-shunt diode comprise PN diodes.

* * * * *